United States Patent
Liu et al.

(10) Patent No.: US 9,646,847 B2
(45) Date of Patent: May 9, 2017

(54) METHOD FOR MANUFACTURING ARRAY SUBSTRATE, FILM-ETCHING MONITORING METHOD AND DEVICE

(71) Applicant: BOE Technology Group Co., Ltd., Beijing (CN)

(72) Inventors: Zheng Liu, Beijing (CN); Jang Soon Im, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 183 days.

(21) Appl. No.: 14/402,872

(22) PCT Filed: May 23, 2014

(86) PCT No.: PCT/CN2014/078263
§ 371 (c)(1),
(2) Date: Nov. 21, 2014

(87) PCT Pub. No.: WO2015/089997
PCT Pub. Date: Jun. 25, 2015

(65) Prior Publication Data
US 2016/0268139 A1 Sep. 15, 2016

(30) Foreign Application Priority Data
Dec. 20, 2013 (CN) .......................... 2013 1 0714433

(51) Int. Cl.
*H01L 21/311* (2006.01)
*H01L 21/66* (2006.01)
(Continued)

(52) U.S. Cl.
CPC .. *H01L 21/31116* (2013.01); *H01J 37/32082* (2013.01); *H01J 37/32935* (2013.01);
(Continued)

(58) Field of Classification Search
None
See application file for complete search history.

(56) References Cited

U.S. PATENT DOCUMENTS 4,317,698 A * 3/1982 Christol ............... G01N 21/272
216/60
6,333,271 B1  12/2001 Chiu et al.
(Continued)

FOREIGN PATENT DOCUMENTS

CN   101174082 A   5/2008
CN   101458445 A   6/2009
(Continued)

OTHER PUBLICATIONS

Crystec Technology Trading, GmbH. "End point detection for plasma etching" Oct. 18, 2012, downloaded from URL<http://web.archive.org/web/20121018133226/http://www.crystec.com/triende.htm> on Jul. 14, 2016.*
(Continued)

*Primary Examiner* — Joseph Schoenholtz
(74) *Attorney, Agent, or Firm* — Banner & Witcoff, Ltd.

(57) ABSTRACT

A method for manufacturing an array substrate, a film-etching monitoring and a film-etching monitoring device. The monitoring method comprises: monitoring and recording the transmittance reference value of a film after a film pattern is formed; and monitoring the transmittance present value of the film in real time in the process of etching an overcoating layer to form a through hole after the overcoating layer is formed on the film pattern, and monitoring the etching degree of the film by determining the variation between the transmittance present value and the transmittance reference value. The device comprises a plurality of light sources (3) and a plurality of light-sensitive probes (4) disposed in the chamber. The light sources (3) are configured
(Continued)

to irradiate the film on a substrate; and the light-sensitive probes (4) are configured to sense the transmittance of the film.

8 Claims, 2 Drawing Sheets

(51) Int. Cl.
*H01J 37/32* (2006.01)
*H01L 29/66* (2006.01)

(52) U.S. Cl.
CPC ........ *H01J 37/32972* (2013.01); *H01L 22/12* (2013.01); *H01L 22/26* (2013.01); *H01L 29/66757* (2013.01); *H01L 29/66765* (2013.01); *H01J 2237/334* (2013.01); *H01J 2237/3343* (2013.01)

(56) References Cited

U.S. PATENT DOCUMENTS

| | | | |
|---|---|---|---|
| 6,677,246 | B2 | 1/2004 | Scanlan et al. |
| 7,049,034 | B2 | 5/2006 | Martin et al. |
| 2002/0048960 | A1 | 4/2002 | Scanlan et al. |
| 2004/0032593 | A1* | 2/2004 | Venugopal ......... G01B 11/0625 356/504 |
| 2004/0221957 | A1 | 11/2004 | Ludviksson |
| 2005/0029228 | A1* | 2/2005 | Nozawa ............. G01B 11/0675 216/60 |
| 2005/0053847 | A1 | 3/2005 | Martin et al. |
| 2005/0068519 | A1 | 3/2005 | O'Meara et al. |
| 2008/0099435 | A1* | 5/2008 | Grimbergen ............. G03F 1/80 216/60 |
| 2012/0289006 | A1* | 11/2012 | Yuan ................... H01L 27/1288 438/158 |

FOREIGN PATENT DOCUMENTS

| | | | |
|---|---|---|---|
| CN | 101459049 | A | 6/2009 |
| CN | 102044431 | A | 5/2011 |
| CN | 102709283 | A | 10/2012 |
| CN | 103811291 | A | 5/2014 |
| JP | S57116342 | A | 7/1982 |
| JP | S59144134 | A | 8/1984 |
| KR | 20091022471 | A * | 9/2008 |
| KR | 20090102471 | A * | 9/2009 |

OTHER PUBLICATIONS

Machine Translation of KR2009102471.*
Sun H. C. and Whittaker E. A., "Real-time in situ detection of in a plasma reactor" Appl. Phys. Lett. 63 1035-7 (1993).*
Kim, Suhong, Pete Klimecky, Jay B. Jeffries, Fred L. Terry, and Ronald K. Hanson. "In Situ Measurements of HCl during Plasma Etching of Poly-silicon Using a Diode Laser Absorption Sensor." Measurement Science and Technology Meas. Sci. Technol. 14.9 (2003): 1662-670.*
Machine Translation of KR 2009102471.*
Jan. 4, 2016—(CN)—First Office Action Appn 201310714433.9 with English Tran.
International Search Report and Written Opinion mailed Jul. 25, 2014 (PCT/CN2014/078263); ISA/CN.
Written Opinion mailed Jul. 11, 2014 (PCT/CN2014/078263); ISA/CN.
Jun. 29, 2016—(CN)—Second Office Action Appn. 201310714433.9 with English Tran.
Jun. 21, 2016—International Preliminary Report on Patentability Appn PCT/CN2014/078263.
Oct. 27, 2016 (CN) Office Action for CN application 201310714433.9 with English translation.

* cited by examiner

METHOD FOR MANUFACTURING ARRAY SUBSTRATE, FILM-ETCHING MONITORING METHOD AND DEVICE

The application is a U.S. National Phase Entry of International Application PCT/CN2014/078263 filed on May 23, 2014, designating the United States of America and claiming priority to Chinese Patent Application No. 201310714433.9, filed on Dec. 20, 2013. The present application claims priority to and the benefit of all the above-identified applications and all of the above-identified applications are incorporated by reference herein in their entireties.

TECHNICAL FIELD

Embodiments of the present invention relate to a method for manufacturing an array substrate, a film-etching monitoring method and a film-etching monitoring device.

BACKGROUND

Currently, as low-temperature polysilicon display substrates have higher drive capability compared with amorphous silicon display substrates, higher display quality can be easily obtained, and hence low-temperature polysilicon display substrates are more and more favored by users. FIG. 1 is a schematic structural view of a typical top-gate array substrate. The array substrate comprises a transparent substrate 101' such as glass or the like, a buffer layer 102', a polysilicon active layer 103', a gate insulating layer 104', a gate metal layer 105' and an interlayer insulating layer 106'. In the process of etching a through hole, a mask is formed on the interlayer insulating layer 106' by a photolithography process; and a region to be etched is etched and removed by dry etching, so as to form the through hole. In the subsequent process, a metal can be deposited into the through hole so as to connect with the polysilicon active layer.

As the difference of the sum of the thickness of the gate insulating layer 104' and the thickness of the interlayer insulating layer 106' from the thickness of the active layer is very large (the ratio of both is more than 10:1), the etching process is very difficult. Moreover, whether etching is conducted immediately till the surface of the polysilicon active layer cannot be easily and effectively monitored, and hence the active layer tends to be over-etched. Therefore, the production yield of the polysilicon substrate can be reduced. Particularly when the dimension of the substrate is large, the etching degree of the entire substrate can be more difficultly determined.

Of course, other films beside the active layer also have the problem of over-etching in the etching process.

SUMMARY

Embodiments of the present invention provide a method for manufacturing an array substrate, a film-etching monitoring method and a film-etching monitoring device, so as to determine the etching degree of films such as an active layer and hence avoid the over-etching problem and not affect the performances of the films such as the active layer.

At least one embodiment of the present invention provides a film-etching monitoring method, which comprises: monitoring and recording the transmittance reference value of a film after a film pattern is formed; and monitoring the transmittance present value of the film in real time in the process of etching an overcoating layer to form a through hole after the overcoating layer is formed on the film pattern, and monitoring the etching degree of the film by determining the variation between the transmittance present value and the transmittance reference value.

In one embodiment, for instance, the transmittance value of a plurality of points at different positions of the film is monitored.

In one embodiment, for instance, the transmittance value of 9 to 25 points at different positions of the film is monitored.

In one embodiment, for instance, the transmittance present value of the film is monitored in real time; and when the transmittance present value is 100 to 120 percent of the transmittance reference value, the etching process is stopped.

In one embodiment, for instance, the film is an active layer; and the overcoating layer is a gate insulating layer and an interlayer insulating layer.

In one embodiment, for instance, the ratio of the sum of the thickness of the gate insulating layer and the thickness of the interlayer insulating layer to the thickness of the active layer is more than 10:1.

In one embodiment, for instance, the process of forming the active layer pattern includes: depositing an amorphous silicon layer, forming a polysilicon layer by crystallizing amorphous silicon, and forming the active layer pattern by patterning the polysilicon layer.

In one embodiment, for instance, the process of monitoring and recording the transmittance reference value of the active layer includes: irradiating the active layer via light beams, sensing the transmittance of the active layer pattern, and taking the transmittance as the transmittance reference value of the active layer.

Another embodiment of the present invention further provides a method for manufacturing an array substrate, which comprises: forming a pattern of an active layer on a substrate, and monitoring and recording the transmittance reference value of the active layer; depositing an overcoating layer and a gate electrode layer on the substrate obtained after the above step, in which the overcoating layer includes a gate insulating layer and an interlayer insulating layer; etching the overcoating layer to form a through hole, monitoring the transmittance present value of the active layer in real time in the etching process, and stopping etching when the transmittance present value reaches a default value of the transmittance reference value; and forming a source/drain electrode layer on the substrate obtained after the above step, in which source/drain electrodes are electrically connected with the active layer via the through hole.

In one embodiment, a buffer layer is deposited on the substrate at first and hence a pattern of the active layer is formed on the buffer layer.

Another embodiment of the present invention further provides a film-etching monitoring device, which comprises a chamber and a light source and a plurality of light-sensitive probes disposed in the chamber. The light source is configured to irradiate a film on a substrate, and the light-sensitive probes are configured to sense the transmittance of the film.

In one embodiment, for instance, the chamber is a vacuum chamber communicated with a reaction gas source; and an etching device is disposed in the vacuum chamber.

In one embodiment, for instance, the etching device includes: an upper polar plate and a lower polar plate disposed opposite to each other, in which one polar plate is grounded and the other polar plate is connected with a radio-frequency power supply so that plasmas for etching the substrate are generated between the upper polar plate and the lower polar plate; and the substrate to be etched is disposed on the lower polar plate.

In one embodiment, for instance, the light source is disposed on the upper polar plate; or the light source is disposed on a side wall of the vacuum chamber; or the light source is disposed on an upper wall of the vacuum chamber.

In one embodiment, for instance, the light-sensitive probes are disposed on one side of the lower polar plate away from the substrate.

In one embodiment, for instance, the number of the light-sensitive probes is 5 to 25; and the light-sensitive probes are uniformly distributed.

In one embodiment, for instance, the film-etching monitoring device further comprises a radio-frequency power supply adopting intermittent supply means. The radio-frequency power supply provides radio-frequency current at the power-on period to generate plasmas. The film-etching monitoring device monitors the transmittance of the film at the power-off period.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

Figure 1:
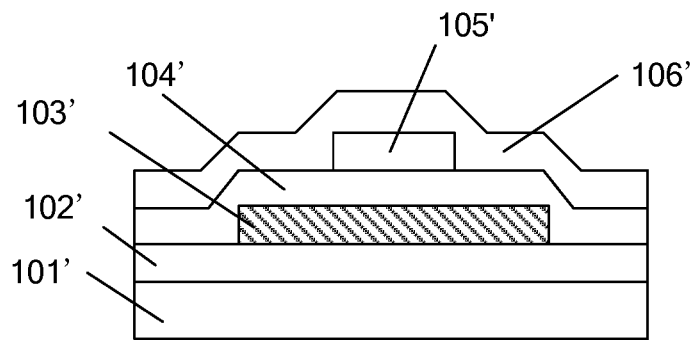
FIG. 1 is a schematic diagram of a prior art top-gate array substrate.

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Embodiment 1

The embodiment of the present invention provides a film-etching monitoring method, which comprises: monitoring and recording the transmittance reference value of a film after a film pattern is formed; and forming an overcoating layer on the film pattern, monitoring the transmittance present value of the film in real time in the process of etching the overcoating layer to form a through hole subsequently, and monitoring the etching degree of the film by determining the variation between the transmittance present value and the transmittance reference value.

In the embodiment of the present invention, in order to guarantee the etching uniformity of the entire substrate, the transmittance value of a plurality of points at different positions of the film can be monitored. For instance, the transmittance value of 9 to 25 points at different positions of the film can be monitored. Of course, the number of the specific positions can be determined according to actual demands.

In an actual etching process, the transmittance present value of the film is monitored in real time. For instance, when the transmittance present value is 100 to 120 percent of the transmittance reference value, the etching process is stopped.

In an actual application, the monitoring method provided by the embodiment is generally applied to substrate structures with a film of a low thickness but an overcoating layer of a relatively high thickness. The film, for instance, may be an active layer, a source/drain electrode layer and the like involved in the process of preparing a thin-film transistor (TFT), but the overcoating layer may be a gate insulating layer, a passivation layer and the like formed on the film. As the overcoating layer is relatively thicker than the film, the underlying thin film can be easily over-etched if no monitoring means is adopted in the process of etching the overcoating layer to form a through hole, and hence the normal use performance of the film can be affected.

The film-etching monitoring method provided by the embodiment of the present invention can effectively monitor the etching degree of the film by comparing the transmittance of the film on different states, so as to guarantee that the film is not over-etched and guarantee the performances of the film, and hence improve the yield of products.

Embodiment 2

Detailed description will be given below to the film-etching monitoring method by taking the case that the monitored film is an active layer as an example.

The active layer etching monitoring method provided by the embodiment of the present invention comprises the following steps.

Step S201: monitoring and recording the transmittance reference value of an active layer after a pattern of the active layer is formed.

In the embodiment of the present invention, one specific example of the process of forming the pattern of the active layer includes: depositing an amorphous silicon layer at the temperature of less than 600 centigrade (° C.) by plasma-enhanced chemical vapor deposition (PECVD), low-pressure chemical vapor deposition (LPCVD) or sputtering means. The thickness of the amorphous silicon layer may be 100 Å to 3,000 Å, preferably 500 Å to 1,000 Å.

Subsequently, the amorphous silicon layer may be converted into a polysilicon layer by excimer laser crystallization, metal-induced crystallization, solid-phase crystallization or the like means. It should be noted that the processes of different crystallization methods and the structure of TFTs are different. The processes such as heat treatment dehydrogenation, metal-induced deposition, heat treatment crystallization, excimer laser irradiation crystallization, doping (P-type or N-type doping) of source/drain regions, and activation of doped impurities must be added as required in the preparation process.

After amorphous silicon is converted into the polysilicon layer, a mask is formed by a photolithography process. Subsequently, the pattern of the active layer is formed by dry etching.

In the embodiment of the present invention, one example of the process of monitoring and recording the transmittance reference value of the active layer includes: monitoring and recording the transmittance of a polysilicon region. For instance, the substrate may be irradiated by a light beam; the transmittance of the active layer pattern is sensed and measured; and the transmittance is taken as the transmittance reference value of the active layer. In order to guarantee the etching uniformity of the entire substrate, a plurality of data values at different positions of the active layer may be monitored, for instance, the data values at 9 to 25 points are measured. The positions, for instance, may be uniformly distributed on the active layer.

Step S202: forming an overcoating layer on the active layer pattern, monitoring the transmittance present value of the active layer in real time in the process of etching the overcoating layer to form a through hole, and monitoring the etching degree of the active layer by determining the variation between the transmittance present value and the transmittance reference value.

In the embodiment of the present invention, the overcoating layer is etched by plasma etching, reactive ion etching or inductively coupled plasma (ICP) etching, and the etching gas is fluorine-containing or chlorine-containing gas. In the etching process, the transmittance present value of the active layer is monitored in real time. For instance, when the transmittance present value reaches a default value (for instance, 100 to 120 percent) of the transmittance reference value, it indicates that the active layer has been just etched, and hence the etching process is stopped.

The active layer etching monitoring method provided by the embodiment of the present invention can effectively monitor the etching degree of the active layer by comparing the transmittance of the active layer on different states, greatly guarantee that the active layer is not over-etched, guarantee the performance of the active layer, and hence improve the yield of products.

Embodiment 3

The embodiment of the present invention provides a method for manufacturing an array substrate. In order to highlight the active layer monitoring effect, the array substrate adopts a top-gate structure.

The method for manufacturing the array substrate comprises the following steps.

Step S301: depositing a buffer layer on a substrate.

Figure 2A:
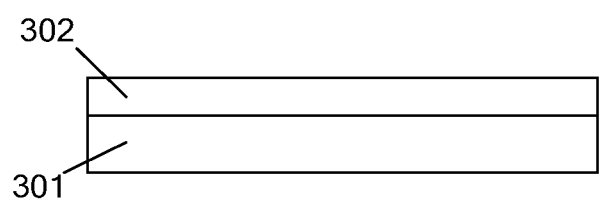
FIGS. 2A to 2D are schematic structural views illustrating the steps in a method for manufacturing an array substrate provided by an embodiment of the present invention.

As illustrated in FIG. 2A, a buffer layer 302 is formed on a pre-washed transparent substrate 301, for instance, a glass substrate, by PECVD, LPCVD, atmospheric pressure chemical vapor deposition (APCVD), electron cyclotron resonance chemical vapor deposition (ECR-CVD) or sputtering means so as to prevent impurities contained in the transparent substrate from being diffused into the subsequently formed active layer and avoid the influence of the characteristics of TFT elements such as threshold voltage and drain current.

The buffer layer may be a single layer of silicon oxide or silicon nitride or a stacked layer of both. The thickness of the layer may be 300 Å to 10,000 Å, preferably 500 Å to 4,000 Å. The deposition temperature is 600 centigrade or less than 600 centigrade.

In addition to the introduction of the buffer layer, as the conventional alkali glass contains a high content of metal impurities such as aluminum, barium and sodium, the metal impurities tend to be diffused in the high-temperature treatment process. Alkali-free glass may also be taken as the transparent substrate.

Step S302: forming a pattern of an active layer on the buffer layer, and monitoring and recording the transmittance reference value of the active layer.

Figure 2B:
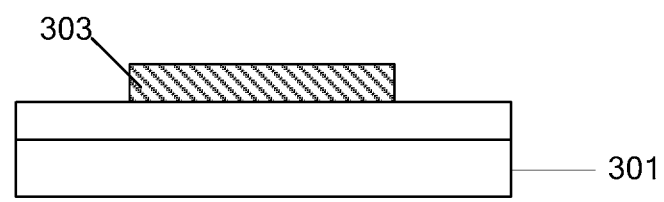

As illustrated in FIG. 2B, an amorphous silicon layer 303 is deposited on a buffer layer 302 at the deposition temperature of less than 600 centigrade by PECVD, LPCVD or sputtering means. The thickness of the amorphous silicon layer 303 is 100 Å to 3,000 Å, preferably 500 Å to 1,000 Å. Subsequently, the amorphous silicon layer 303 is converted into a polysilicon layer by excimer laser crystallization, metal-induced crystallization, solid-phase crystallization and other means. It should be noted that the processes of different crystallization methods and the structures of TFTs are different. The processes such as heat treatment dehydrogenation, metal-induced deposition, heat treatment crystallization, excimer laser irradiation crystallization, doping (P-type or N-type doping) of source/drain regions and activation of doped impurities must be added as required in the preparation process. After the amorphous silicon layer is converted into the polysilicon layer, a mask is formed by a photolithography process. Subsequently, a pattern is formed by dry etching and taken as an active layer pattern of a TFT.

The transmittance of a polysilicon region is monitored and recorded. For instance, the substrate may be irradiated by a light beam; the transmittance of the active layer pattern is sensed and measured; and the transmittance is taken as the transmittance reference value of the active layer. The transmittance is taken as the reference value of the subsequently monitored etching degree. In order to guarantee the etching uniformity of the entire substrate, a plurality of data values at different positions are monitored, for instance, the data values at 9 to 25 points are measured.

Step S303: depositing a gate insulating layer, a gate electrode layer and an interlayer insulating layer, and forming a back panel of a through hole to be etched.

Figure 2C:
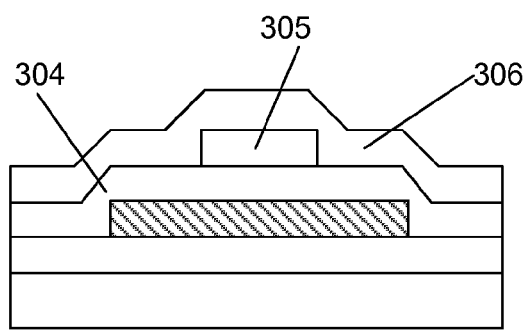

As illustrated in FIG. 2C, a gate insulating layer 304 is deposited by PECVD, LPCVD, APCVD, ECR-CVD or other means; subsequently, a gate electrode layer 305 is deposited on the gate insulating layer by sputtering, thermal evaporation, PECVD, LPCVD, APCVD, ECR-CVD or other means; and a mask is formed by a photolithography process and a pattern is formed by etching the gate electrode layer 305 by wet etching or dry etching.

Appropriate thickness of the gate insulating layer 304 may be selected according to the specific process. For instance, the thickness of the gate insulating layer 304 is 300 Å to 3,000 Å. The gate insulating layer 304 may be a single layer of silicon oxide or silicon nitride or a stacked layer of both. The deposition temperature is generally less than 600 centigrade. The gate electrode layer 305 is made of a metal such as molybdenum, a metal alloy such as a molybdenum alloy, or a conductive material such as doped polysilicon. The thickness of the gate electrode layer 305 is 1,000 Å to 8,000 Å, preferably 2,500 Å to 4,000 Å.

An interlayer insulating layer 306 is formed on the gate insulating layer. The thickness of the interlayer insulating layer 306 is 3,000 Å to 9,000 Å, preferably 4,000 Å to 6,000 Å. The interlayer insulating layer may be deposited at the deposition temperature of less than 600 centigrade by PECVD, LPCVD, APCVD, ECR-CVD or other means. The interlayer insulating layer 306 may be a single layer of silicon oxide or a stacked layer of silicon oxide and silicon nitride.

Step S304: forming a mask by a photolithography process, forming a through hole by dry etching, monitoring the transmittance of the through hole, and stopping etching when the transmittance is 100 to 120 percent of the previously recorded transmittance reference value of the active layer.

Figure 2D:
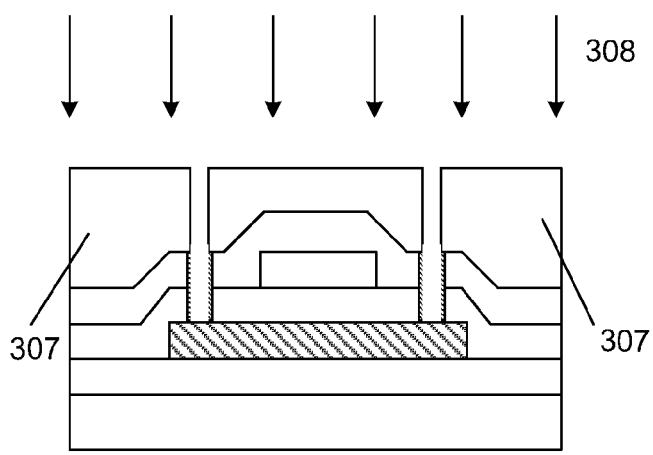

As illustrated in FIG. 2D, a photoresist mask layer 307 is formed on the interlayer insulating layer 306 by a photolithography process. The thickness of the photoresist mask layer 307 is, for instance, 10,000 Å to 20,000 Å. Under the shielding of the mask layer, a region to be etched may be removed by dry etching. The dry etching process may adopt plasma etching, reactive ion etching, ICP etching or other means. The etching gas may be fluorine-containing or chlorine-containing gas, such as CF4, CHF3, SF6, CCl2F2 or a mixed gas of any of the gases and O2. In the etching process, the transmittance of 9 to 25 points is monitored by same method in the step S302 and compared with data recorded in the step S302, namely the etching degree of the active layer is monitored by determining the variation between the transmittance present value and the transmittance reference value of the active layer, monitored in real time. The etching method can also well monitor the etching degree of the active layer even when the difference of the sum of the thickness of the gate insulating layer and the thickness of the interlayer insulating layer from the thickness of the active layer is very large (for instance, the ratio of both is more than 10:1), and hence correspondingly control the etching progress.

Moreover, when the transmittance is 100 to 120 percent of the previously recorded transmittance reference value, it indicates that the polysilicon layer (the active layer) has been just etched, and hence the etching process can be stopped.

Step S305: forming a source/drain electrode layer on the substrate obtained after the above step, in which source/drain electrodes are electrically connected with the active layer via the through hole.

The method for manufacturing the array substrate can control the etching degree of the active layer in real time, guarantee that the active layer is not over-etched, and improve the yield of products.

In another embodiment of the present invention, the buffer layer may also be formed on a surface of the substrate as required, namely the active layer is directly formed on the surface of the substrate.

Embodiment 4

Figure 3:
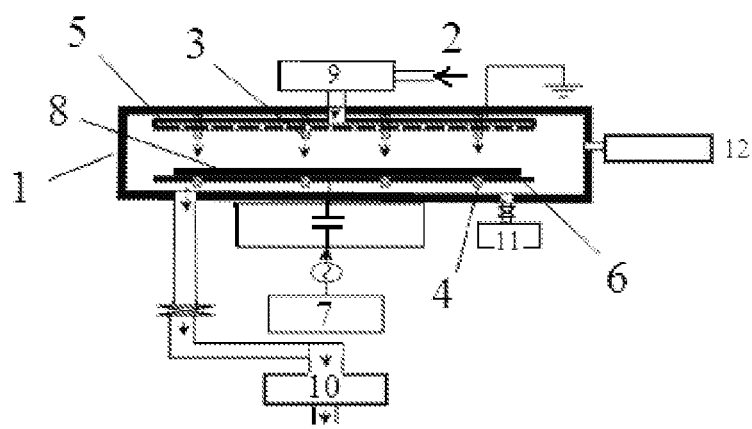
FIG. 3 is a schematic structural view of an active layer etching monitoring device provided by an embodiment of the present invention.

As illustrated in FIG. 3, the embodiment of the present invention provides a film-etching monitoring device, which comprises a chamber and a light source 3 and a plurality of light-sensitive probes 4 disposed in the chamber. The light source 3 is configured to irradiate a film on a substrate. The light-sensitive probes 4 are configured to sense the transmittance of the film.

The light source 3, for instance, includes a fluorescent lamp, a light-emitting diode (LED) or the like and may be a point source, a line source, a surface source or the like. The light-sensitive probes 4 include photodiodes or the like.

In the embodiment of the present invention, the film-etching monitoring device may be independent of the etching device and is an independent transmittance monitoring device. However, in view of the production efficiency, another embodiment of the present invention may also integrate the transmittance monitoring device and the etching device.

For instance, the chamber is provided as a vacuum chamber 1; the vacuum chamber is communicated with a reaction gas source 2; and the etching device is also disposed in the vacuum chamber 1.

The etching device in the embodiment is a dry etching device and includes an upper polar plate 5 and a lower polar plate 6 disposed opposite to each other; the upper polar plate 5 is grounded; the lower polar plate 6 is connected with a radio-frequency power supply 7; a substrate 8 is disposed on the lower polar plate 6; and the radio-frequency power supply 7 provides a radio-frequency current to generate plasmas for etching the substrate 8.

For instance, the light source 3 may be disposed above the upper polar plate 5 or an upper wall of the vacuum chamber 1, so that light beams thereof irradiate down, and hence a vertical light source is formed. Of course, the light source 3 may also be disposed on a side wall of the vacuum chamber 1, so that light beams thereof irradiate obliquely, and hence an oblique source is formed.

The etching device in the embodiment of the present invention may also be other dry etching device, for instance, a plasma etching (PE) device and an ICP etching device.

In order to monitor the uniformity of the transmittance of the entire substrate, the number of the light-sensitive probes 4 may be 5 to 25. The light-sensitive probes are uniformly distributed on the lower polar plate 6. Of course, the number of the light-sensitive probes 4 may be determined as required. In addition, in at least one embodiment, the device further includes a flowmeter 9 for controlling the amount of reaction gas flowing into the vacuum chamber 1 from the reaction gas source 2.

For instance, the vacuum chamber 1 is connected with a vacuum pump 10, a vacuum gauge 11 and a pressure switch 12 configured to maintain and control the vacuum degree of the vacuum chamber 1.

When the film-etching monitoring device is adopted, the reference data of transmittance are obtained after the process of dry etching in the step S302; and subsequently, the transmittance present value is detected in the process of dry etching in the step S304 and compared with the reference data.

As light generated by the light source will be interfered by the plasmas generated in the working process of the dry etching device, the generation of the plasmas must be suspended in the detection process. Therefore, at least one embodiment of the present invention further comprises a radio-frequency power supply adopting intermittent supply means. The radio-frequency power supply provides a radio-frequency current at the power-on period to generate plasmas. The film-etching monitoring device provided by the embodiment monitors the transmittance of the film at the power-off period.

The etching degree in the process of etching the through hole can be monitored in real time by additionally arranging the light source and the light-sensitive probes in the etching device, so that the etching degree can be simply and effectively controlled; the etching process can be stopped in time when the active layer has been just etched; and the performance of the active layer is guaranteed not to be damaged. Moreover, with the arrangement of a plurality of monitoring points, the etching uniformity of the entire substrate can be guaranteed and the yield of prepared large-area polysilicon substrates can be improved.

The method for manufacturing the array substrate, the film-etching monitoring method and the film-etching monitoring device, provided by the embodiment of the present invention, can effectively monitor the etching degree of the film by comparing the transmittance of the film on different states, so as to guarantee that the film is not over-etched, guarantee the performance of the film, and hence improve the yield of products.

The above description is given for the sake of illustration and description and not exhaustive, or the present invention is not limited to the disclosed form. Many modifications and variations are obvious to those skilled in the art. The preferred embodiments are given for better description of the principle and actual applications of the present invention, so that those skilled in the art can understand the present invention and hence design various embodiments with various modifications, suitable for specific purposes.

The application claims priority to the Chinese patent application No. 201310714433.9 filed on Dec. 20, 2013. The disclosure content of the Chinese patent application is entirely incorporated herein by reference as part of the application.

The invention claimed is:

1. A method for manufacturing an array substrate, comprising:
    forming a pattern of an active layer on a substrate, and monitoring and recording a transmittance reference value of the active layer;
    depositing an overcoating layer and a gate electrode layer on the substrate obtained after the above step, in which the overcoating layer includes a gate insulating layer and an interlayer insulating layer;
    etching the overcoating layer to form a through hole, monitoring a transmittance present value of the active layer in real time in the etching process, and stopping etching when the transmittance present value reaches a default value of the transmittance reference value; and
    forming a source/drain electrode layer on the substrate obtained after the above step, in which source/drain electrodes are electrically connected with the active layer via the through hole.

2. The method according to claim 1, wherein the forming the pattern of the active layer on the substrate further comprises: depositing a buffer layer on the substrate and forming the pattern of the active layer on the buffer layer.

3. The method according to claim 1, wherein the monitoring the transmittance present value of the active layer further comprises monitoring a transmittance present value for each of a plurality of points at different positions of the active layer.

4. The method according to claim 3, wherein the monitoring the transmittance present value for each of the plurality of points comprises monitoring the transmittance present value for 9 to 25 points at different positions of the active layer.

5. The method according to claim 1, wherein the transmittance present value of the active layer is monitored in real time; and when the transmittance present value is 100 to 120 percent of the transmittance reference value, the etching process is stopped.

6. The method according to claim 1, wherein a ratio of a sum of a thickness of the gate insulating layer and a thickness of the interlayer insulating layer to a thickness of the active layer is more than 10:1.

7. The method according to claim 1, wherein the forming the pattern of the active layer on the substrate comprises:
    depositing an amorphous silicon layer, forming a polysilicon layer by crystallizing amorphous silicon, and forming the pattern of the active layer by patterning the polysilicon layer.

8. The method according to claim 1, wherein the monitoring and recording the transmittance reference value of the active layer comprises:
    irradiating the active layer via light beams, sensing a transmittance of the pattern of the active layer, and taking the transmittance as the transmittance reference value of the active layer.

* * * * *